(12) United States Patent  
Caveney

(10) Patent No.: US 7,780,480 B2
(45) Date of Patent: Aug. 24, 2010

(54) COMMUNICATIONS CONNECTOR WITH IMPROVED CONTACTS

(75) Inventor: Jack E. Caveney, Hinsdale, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 12/366,804

(22) Filed: Feb. 6, 2009

(65) Prior Publication Data

US 2009/0227151 A1 Sep. 10, 2009

Related U.S. Application Data

(60) Provisional application No. 61/027,123, filed on Feb. 8, 2008.

(51) Int. Cl.
H01R 24/00 (2006.01)
(52) U.S. Cl. ..................... 439/676; 439/76.1
(58) Field of Classification Search ........... 439/676, 439/76.1
See application file for complete search history.

(56) References Cited

U.S. PATENT DOCUMENTS

| 3,369,214 A | 2/1968 | Krumreich et al. |
| 4,224,485 A | 9/1980 | Krumreich |
| 4,648,678 A | 3/1987 | Archer |
| 4,850,902 A * | 7/1989 | Reed .................. 439/676 |
| 4,996,766 A | 3/1991 | Piorunneck et al. |
| 5,145,401 A | 9/1992 | Archer |
| 5,269,707 A | 12/1993 | Reichardt et al. |
| 5,310,360 A | 5/1994 | Peterson |
| 5,399,107 A | 3/1995 | Gentry et al. |
| 5,938,479 A | 8/1999 | Paulson et al. |
| 6,089,923 A | 7/2000 | Phommachanh |
| 6,102,722 A | 8/2000 | Arnett |
| 6,155,881 A | 12/2000 | Arnett et al. |
| 6,346,010 B1 | 2/2002 | Emplit |
| 6,431,917 B1 | 8/2002 | Belopolsky et al. |
| 6,554,653 B2 | 4/2003 | Henneberger |
| 6,767,257 B2 | 7/2004 | Arnett et al. |
| 6,769,937 B1 | 8/2004 | Roberts |
| 6,869,318 B2 | 3/2005 | Viklund et al. |
| 7,427,218 B1 * | 9/2008 | Hashim et al. ............ 439/676 |

* cited by examiner

Primary Examiner—Gary F. Paumen
(74) Attorney, Agent, or Firm—Robert A. McCann; Zachary J. Smolinski

(57) ABSTRACT

A communication jack is provided with plug interface contacts that have a short conductive signal pathway between a plug-jack interface and crosstalk compensation provided on a printed circuit board within the jack. Contacts of the jack are specially designed not to take a permanent set if a six-position plug or an eight-position plug is inserted into an eight-position jack. A printed circuit board in the jack is placed at an angle, shortening the conductive pathway between plug contacts and the printed circuit board.

3 Claims, 13 Drawing Sheets

COMMUNICATIONS CONNECTOR WITH IMPROVED CONTACTS

CROSS-REFERENCE TO RELATED APPLICATION

This application claims priority to U.S. Provisional Patent Application Ser. No. 61/027,123 filed Feb. 8, 2008 which is herein incorporated by reference in its entirety.

FIELD OF THE INVENTION

The present invention relates generally to electrical connectors, and more particularly, to a modular communication jack having an improved contact arrangement for reducing net crosstalk and accommodating different types of plugs.

BACKGROUND OF THE INVENTION

In the communications industry, as data transmission rates have steadily increased, crosstalk due to capacitive and inductive couplings among the closely spaced parallel conductors within the jack and/or plug has become increasingly problematic. Modular connectors with improved crosstalk performance have been designed to meet the increasingly demanding standards. Many of these improved connectors have included concepts disclosed in U.S. Pat. No. 5,997,358, the entirety of which is incorporated by reference herein. In particular, recent connectors have introduced predetermined amounts of crosstalk compensation to cancel offending near end crosstalk (NEXT). In some connectors, stages of compensation are used to account for phase shifts from propagation delay resulting from the distance between the compensation zone and the plug/jack interface. As a result, the magnitude and phase of the offending crosstalk is preferably offset by the compensation, which, in aggregate, has an equal magnitude, but opposite phase from the offending crosstalk.

Recent transmission rates, including those in excess of 500 MHz, have exceeded the capabilities of the techniques of existing jacks. Thus, jacks having improved compensation characteristics are needed.

There is a phase shift from an installed plug to the compensation zones in a jack which is dependent on the distance from the plug/jack electrical interface to the printed circuit board (PCB) which contains the compensation elements, and the dielectric of the surrounding materials. This phase shift is proportional to frequency and the magnitude of required compensation is dependent on the magnitude of phase shift. It is therefore advantageous to minimize this distance and phase shift to maximize the frequency range over which sufficient compensation is attained.

It is therefore advantageous to minimize the length of that portion of the jack contacts which electrically connects an installed plug to the PCB. However, a simple short cantilever contact is not mechanically sound.

An additional problem encountered in the design of electrical communication jacks is the fact that different types of plugs may be inserted into a jack—intentionally or unintentionally. For example, it is possible for a six-contact plug to be inserted into an eight-contact jack. In such a scenario, the six-contact plug will generally have a housing that will cause the first and eighth contacts—the outermost contacts—of the jack to flex farther than they would if an eight-contact plug were inserted into the jack. This can cause the outermost contacts of an eight-contact jack to take a permanent set, reducing or eliminating those contacts' ability to make proper contact with the first and eighth contacts of eight-contact plugs when they are later inserted. It is desirable to have a communication jack in which all contacts, including the outermost contacts, will not take a permanent set if a connector with six contacts is inserted into the jack.

DETAILED DESCRIPTION OF THE PREFERRED EMBODIMENTS

Figure 1:
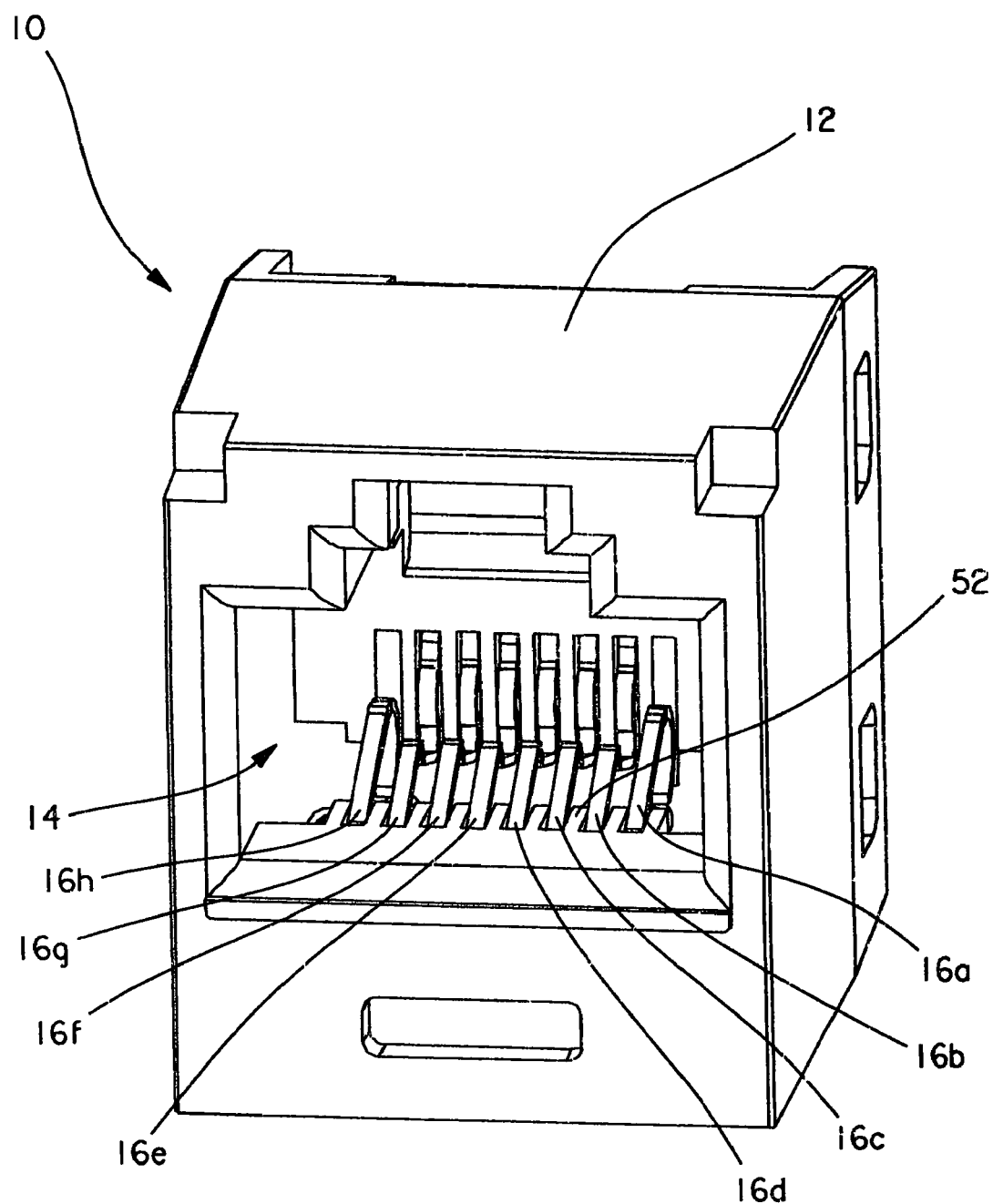
FIG. 1 is a front perspective view of a communication jack.

FIG. 1 is a perspective front view of a communication jack 10 according to one embodiment of the present invention. The communication jack 10 has a housing 12 and an opening 14 for accepting a plug. Plug interface contacts 16a-16h are provided within the opening 14 and positioned to make contact with plug contacts of an inserted plug.

Figure 2:
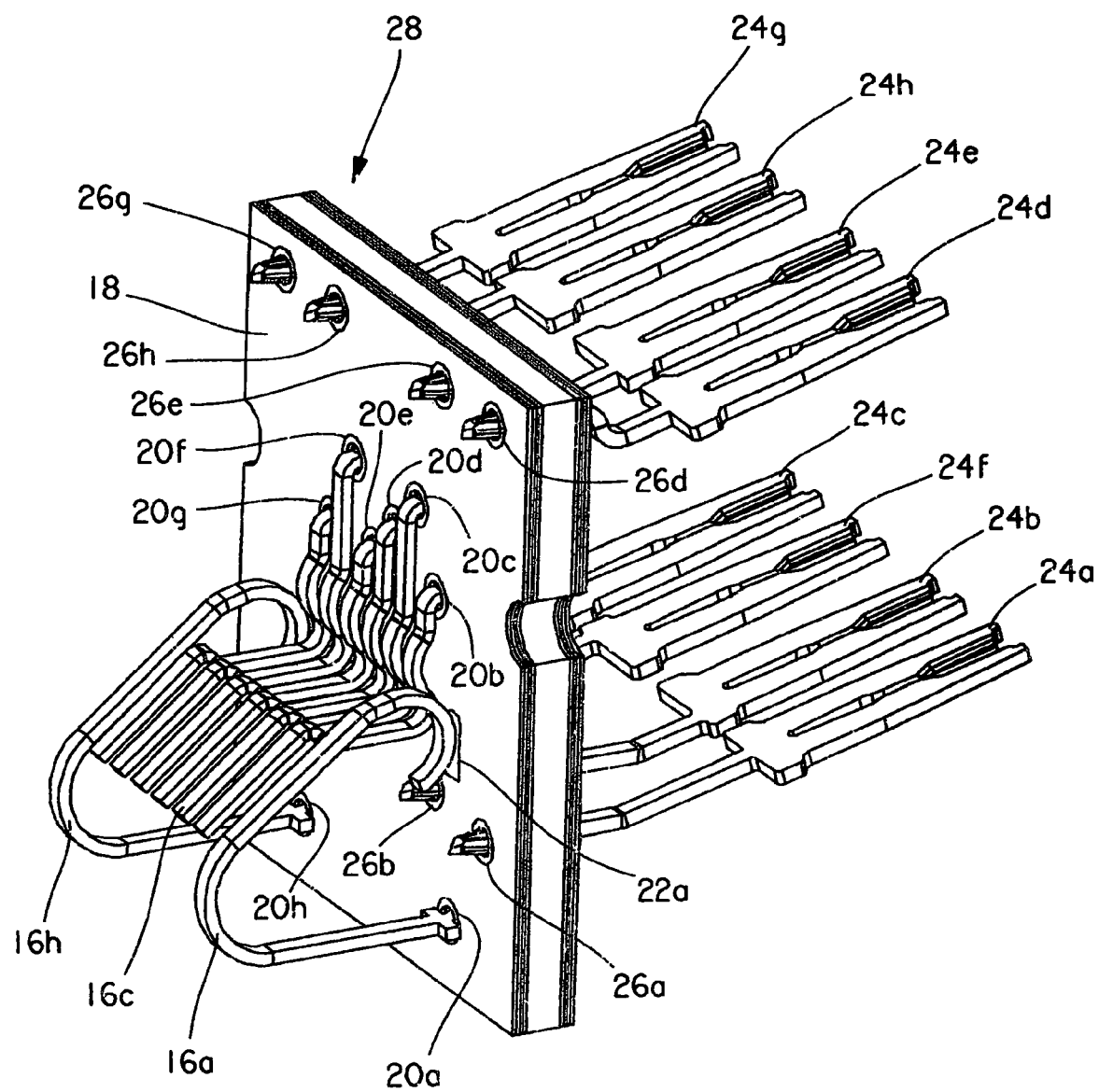
FIG. 2 is a perspective view of a printed circuit board (PCB) and contact assembly.

As shown in FIG. 2, the plug interface contacts 16a-16h are inserted into a PCB 18 at compliant sockets 20a-20h. Compliant pins (not shown in FIG. 2) hold the plug interface contacts 16a-16h within the compliant sockets 20a-20h.

In one embodiment, the compliant sockets 20a-20h serve merely as mechanical attachments for the plug interface contacts 16a-16h and do not provide electrical connections between the compliant plug interface contacts 16a-16h and the PCB 18. In this embodiment, electrical connections between the plug interface contacts 16a-16h and the PCB are made at conductive pads 22a-22h. FIG. 2 shows only conductive pad 22h; the conductive pads 22a-22h are more easily seen in FIG. 7.

Insulation displacement contacts (IDCs) 24a-24h electrically connect first through eighth wires, respectively, of a communication cable (not shown) to the PCB 18. The IDCs 24a-24h are electrically and mechanically connected to the PCB 18 at plated-through IDC vias 26a-26h, respectively. The plug interface contacts, 16a-16h, the IDCs 24a-24h, and the PCB 18 form a jack contact assembly 28. Electrically conductive traces between the plug interface contacts 16a-h and the IDCs 24a-h are provided on the PCB 18, as shown in FIGS. 8-11.

Figure 3:
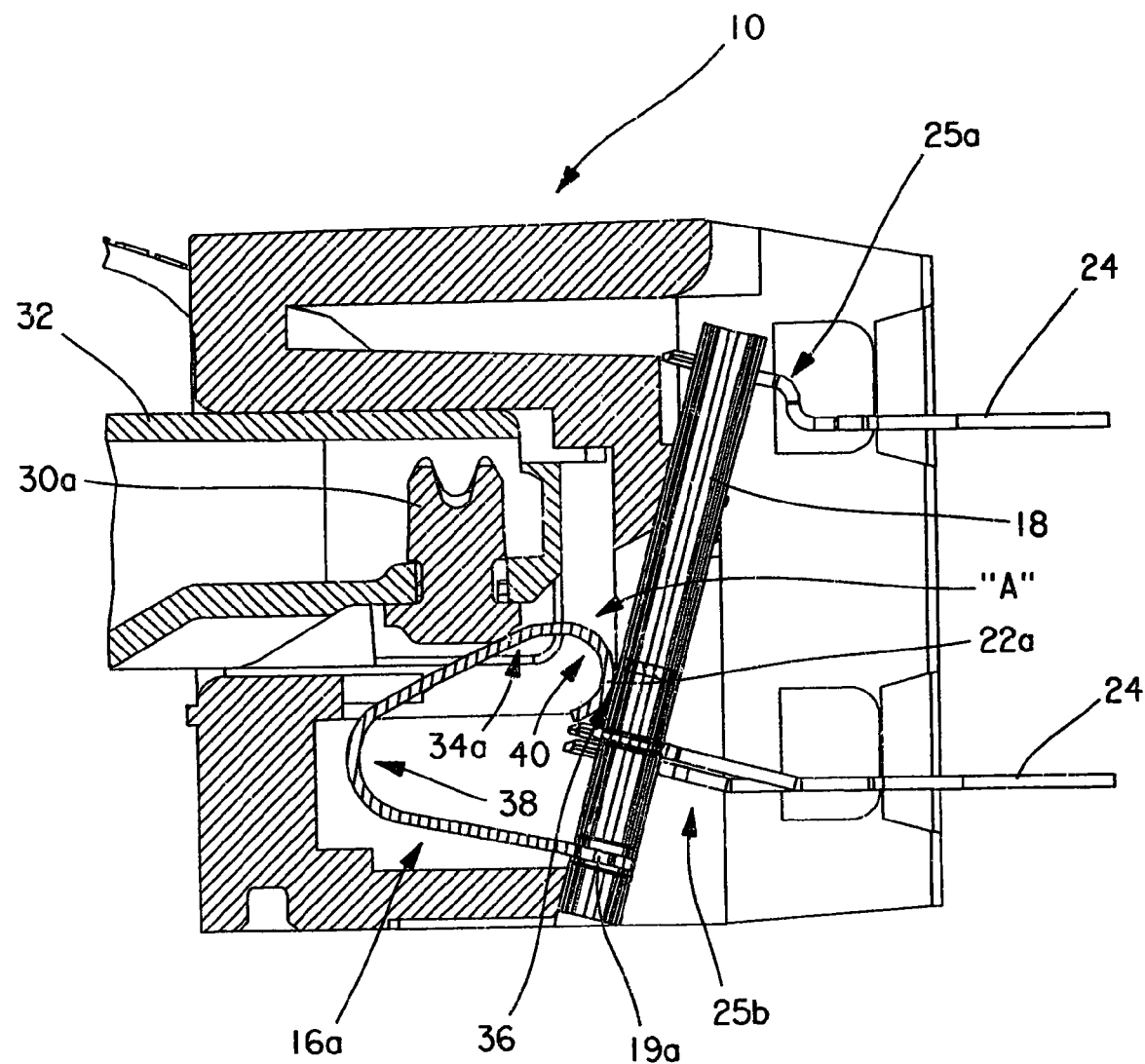
FIG. 3 is a cutaway side view through an outer plug interface contact of a jack showing an eight-contact plug inserted into the jack.

As shown in FIG. 3, the first and eighth plug interface contacts 16a and 16h are designed to mate with contacts of an inserted plug and also to withstand greater deflection without unacceptable deformation of the plug interface contacts. FIG. 3 illustrates the eighth plug interface contact 16a making contact with a plug contact 30h of a plug 32 that has been inserted into the jack 10. In this embodiment, plug interface contact 16a is constructed identically to plug interface contact 16h. The plug interface contact 16a is physically attached to the PCB 18 at compliant pin 19a. The plug interface contact 16a bends to accommodate the plug, while still maintaining proper contact force on both the plug contact 30a and the conductive pad 22a. The plug interface contact 16a contacts the plug contact 30a at a plug/jack interface 34a. Thus, the conductive pathway of a signal through the plug interface contact 16a is between the plug/jack interface 34a and a contact/pad interface 36, where the plug interface contact 16a contacts the conductive pad 22a. The conductive pathway is shown as region "A" in FIG. 3. This conductive pathway is short, allowing compensation within the PCB 18 to be close to the plug contact 30a. Shortening this conductive pathway reduces the phase angle change between offending crosstalk in the plug 32 and compensation on the PCB 18, increasing the effectiveness of the compensation across a wide frequency range.

The PCB 18 is positioned at an angle from the vertical, and this tilting of the PCB also facilitates a shortening of the conductive pathway "A." In the embodiment shown in FIG. 3, the PCB 18 is tilted approximately 15° from the vertical. Greater or lesser angles may be provided as required by specific plug and jack designs. The IDCs 24 are provided with bent portions as shown at 25a and 25b to accommodate the angle of the PCB 18.

Figure 4:
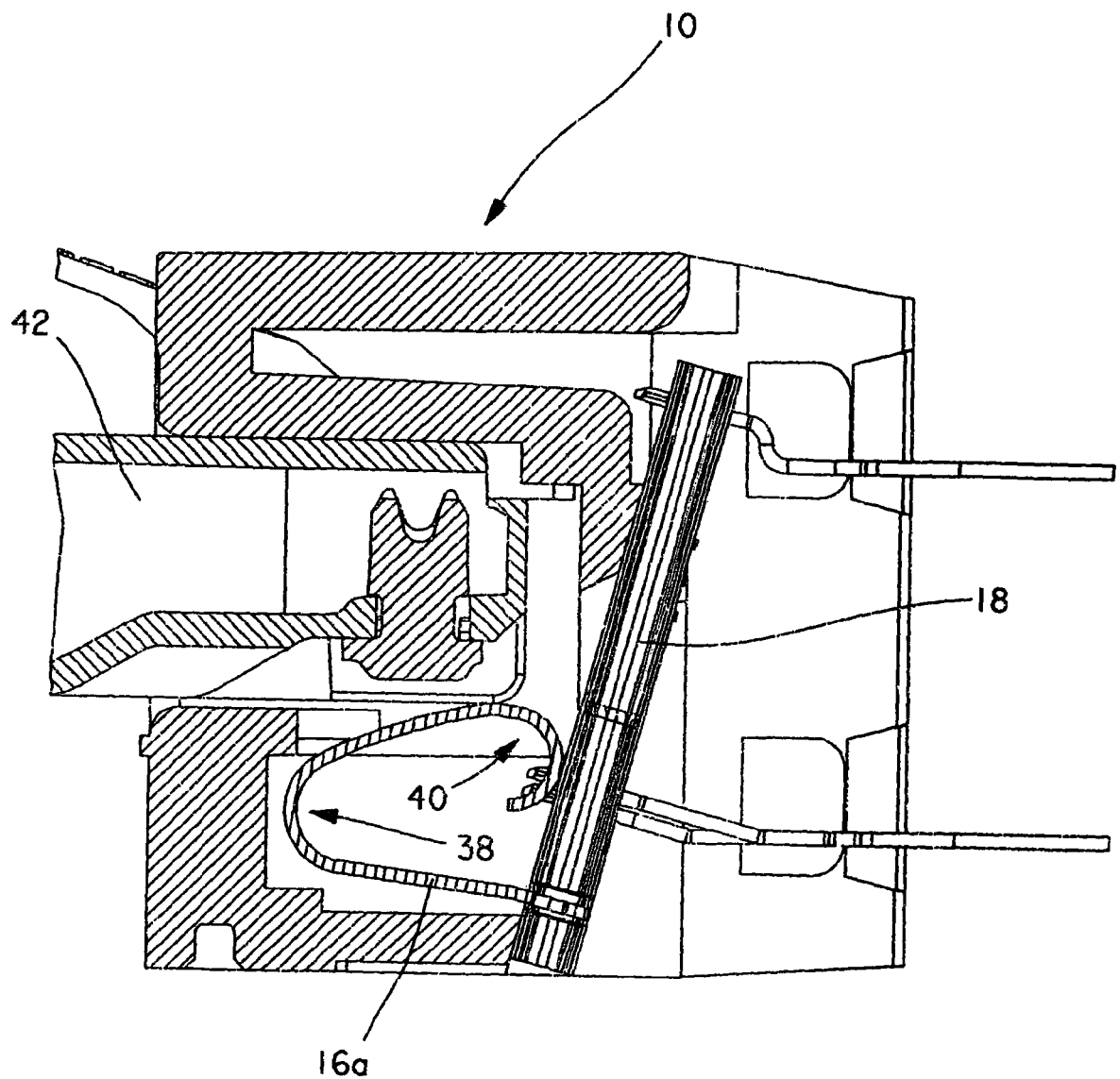
FIG. 4 is a cutaway side view through an outer plug interface contact of a jack showing a six-contact plug inserted into the jack.

The plug interface contact 16a is designed with two radii: a first radius 38 and a second radius 40. These radii are designed to collapse and survive stress from a large deflection, as when a six-position plug 42 is inserted into the jack 10 as shown in FIG. 4. The plug interface contacts 16a and 16h can deflect a large distance without taking a permanent set, thereby enabling their continued use with an eight-position plug 32 as shown in FIG. 3 after a six-position plug 42 has been inserted into the jack as shown in FIG. 4.

Figure 5:
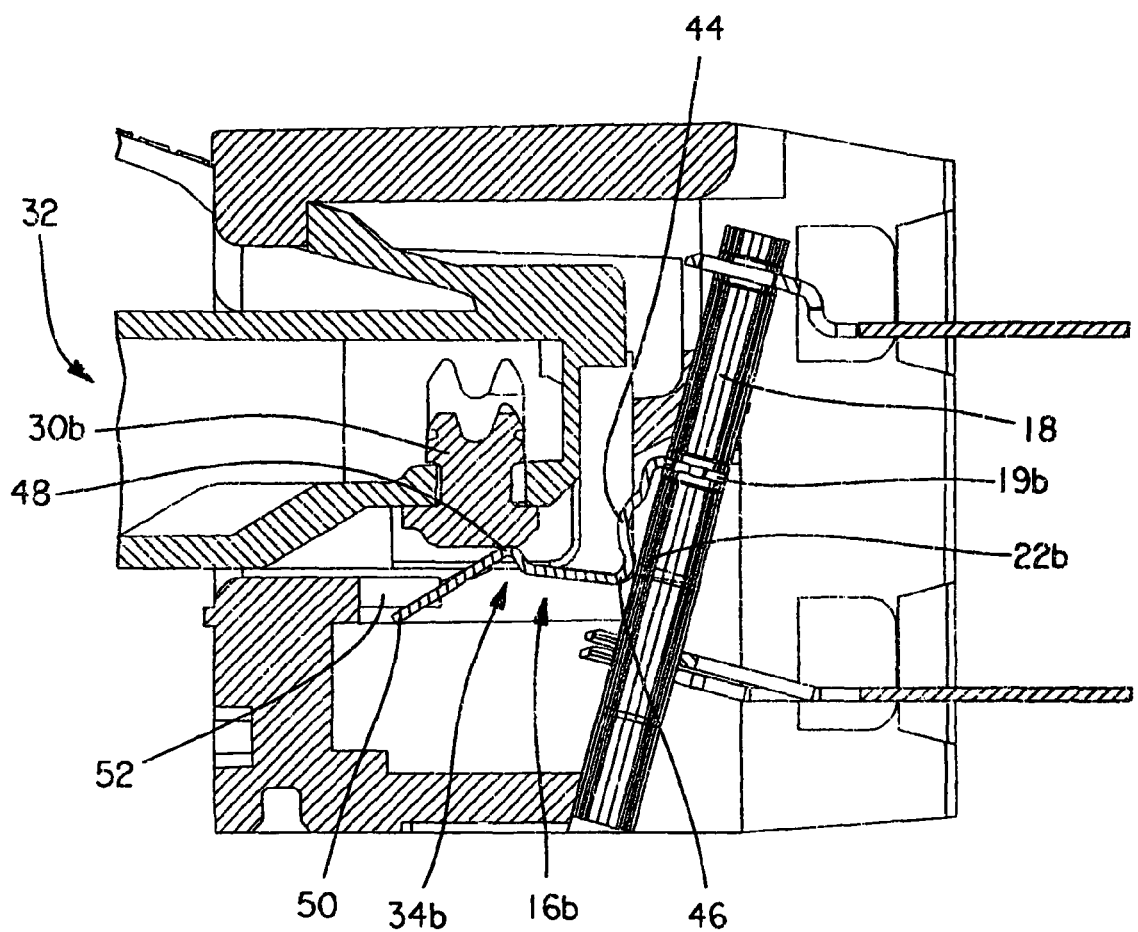
FIG. 5 is a cutaway side view through a plug interface contact of a jack showing a plug inserted into the jack.

FIG. 5 is a cross-sectional side view through another plug interface contact 16b. Plug interface contact 16b as illustrated is representative of the similarly constructed six centrally disposed plug interface contacts 16b-16g. FIG. 5 shows the plug interface contact 16b making electrical contact with a plug contact 30b of an eight-position plug 32 at a plug-jack interface 34b. The plug interface contact 16b is physically attached to the PCB 18 at compliant pin 19b and electrically contacts the PCB 18 at conductive pad 22b. The plug interface contact 16b is provided with curves that allow the plug interface contact 16b to flex upon insertion of a plug 32 without being permanently deformed and to maintain proper contact force with the plug contact 30b and the conductive pad 22b. In the embodiment shown in FIG. 5, three curves are used to maintain proper contact force: a first curve 44, a second curve 46, and a third curve 48.

A first curve 44 is positioned between the compliant pin 19g and a second curve 46, where the plug interface contact 16b contacts the conductive pad 22b. The first curve assures that proper contact force is maintained between the second curve 46 and the conductive pad 22b. In addition to allowing electrical contact between the plug interface contact 16b and the conductive pad 22b, the second curve 46 guides the plug interface contact 16b away from the PCB 18 and toward the plug contact 30b. The third curve 48 is at the plug-jack interface 34b, and it both enables the plug interface contact 16b to make electrical contact with the plug contact 30b and guides the plug interface contact 16b away from the plug contact 30b to its endpoint 50. In the embodiment shown in FIG. 5, the endpoint 50 is free-floating. The plug interface contact 16b is restricted from side-to-side movement by a comb element 52, which is also shown in FIG. 1. Plug interface contacts 16b-16g are able to make electrical contact with plug contacts of either a six-position plug or an eight-position plug.

Figure 6:
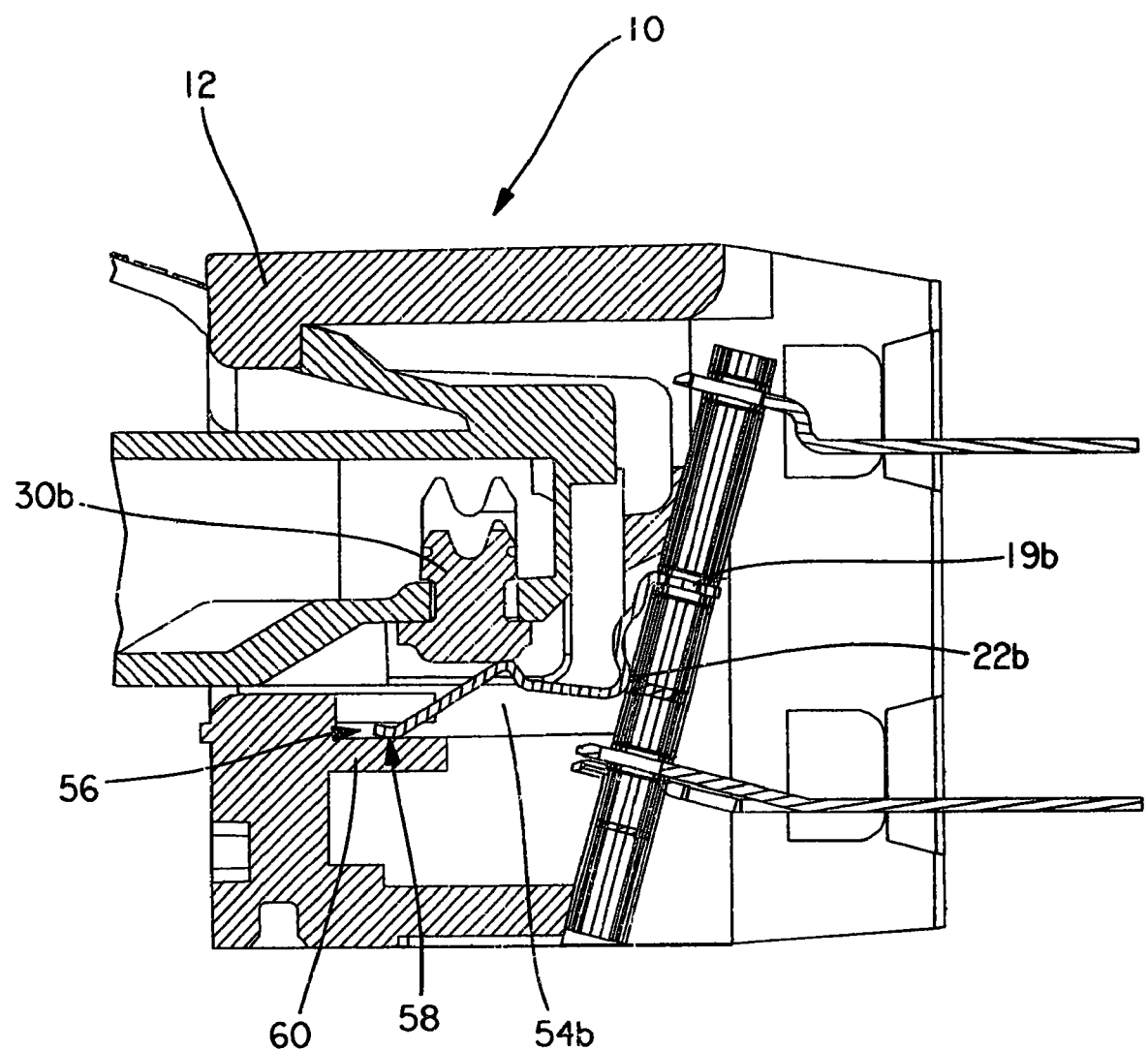
FIG. 6 is a cutaway side view through a plug interface contact of an alternative embodiment of a jack showing a plug inserted into the jack.

FIG. 6 shows an alternative embodiment of a plug interface contact 54b. The plug interface contact 54b is similar to the plug interface contact 16b shown in FIG. 5, except that the endpoint 56 of the plug interface contact 54b is provided with an extra curve 58. The curve 58 rides along a cantilevered support 60 that is an extension of the housing 12 of the jack 10. The design of the plug interface contact 54b provides an additional spring mating force between the plug contact 30b and the plug interface contact 54b.

Figure 7:
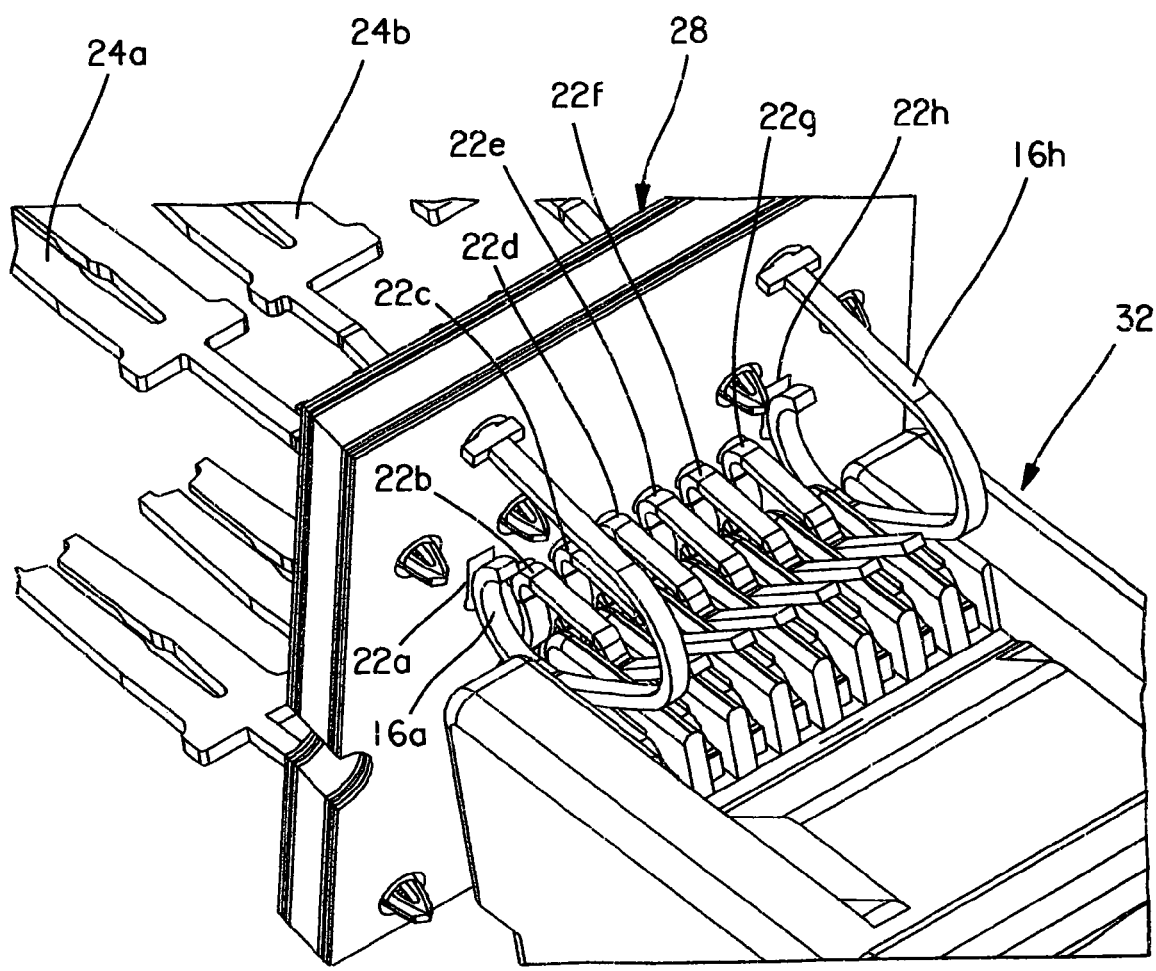
FIG. 7 is a bottom perspective view of plug interface contacts in contact with plug contacts.

FIG. 7 is a bottom perspective view that shows plug interface contacts 16a-16h of a jack contact assembly 28 making electrical contact with plug contacts of an eight-position plug 32. Additional structure of the jack has been removed from FIG. 7 so that the conductive elements are more clearly seen. The conductive pads 22a-h can be seen in electrical contact with the plug interface contacts 16a-h.

Figure 8:
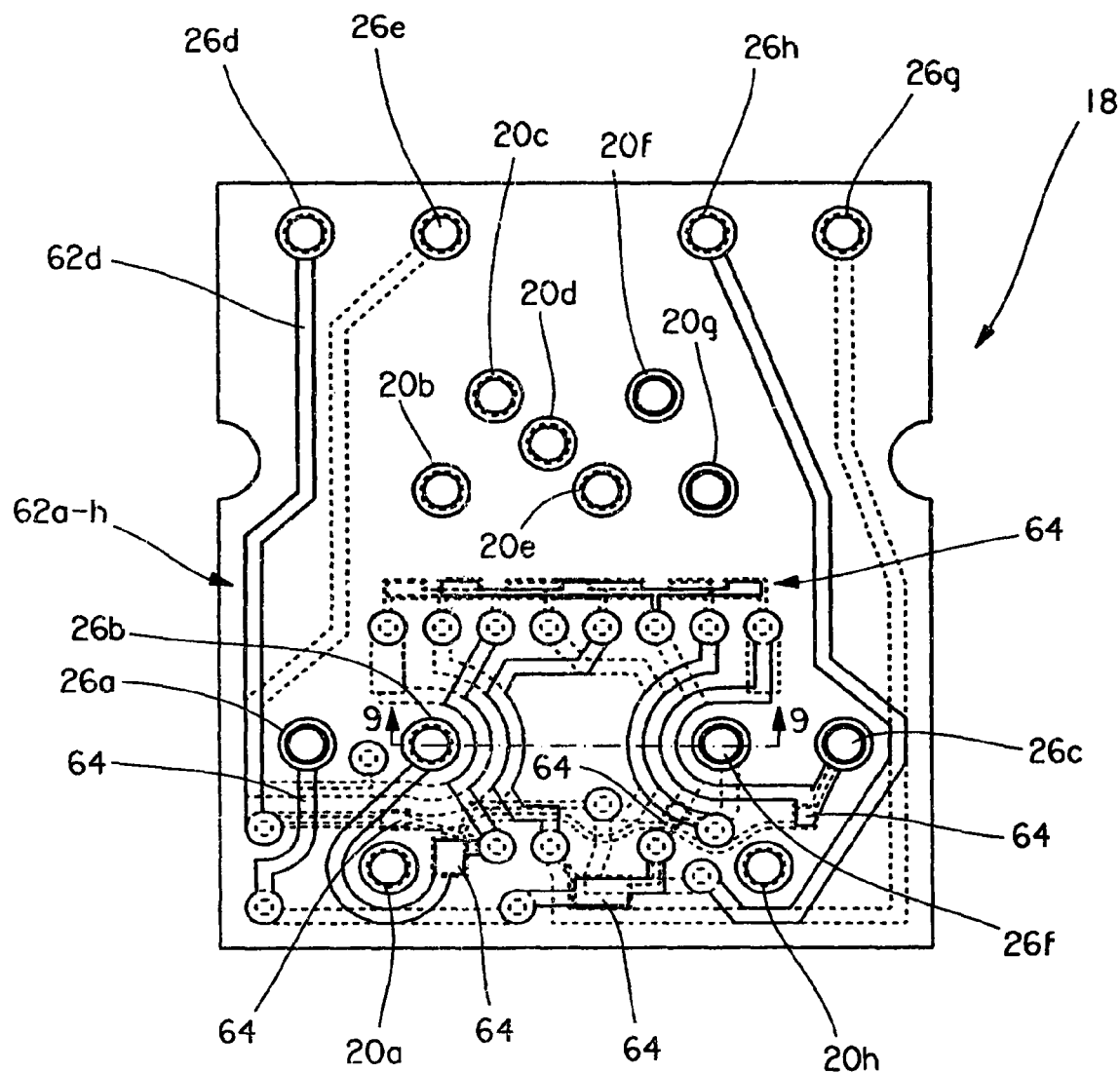
FIG. 8 is a plan view of a PCB showing conductive traces.

FIGS. 8-11 show the conductive traces 62a-h provided on PCB 18 that electrically connect the conductive pads 22a-h to the plated-through vias 26a-h where the IDCs 24a-h are inserted. As shown in FIG. 8, several plate capacitors 64 are provided in connection with the conductive traces 62. The conductive traces 62 and the plate capacitors 64 are sized and positioned on the PCB 18 so that the net inductive and capacitive crosstalk provided by the conductive traces 62 and plate capacitors 64 has approximately the same magnitude as the offending crosstalk produced in a plug, with the opposite polarity.

According to one embodiment, conductive traces 62a-h are provided in eight conductive layers. The solid lines in FIG. 8 show portions of conductive traces that are provided on a first layer, and the dotted lines show portions of conductive traces that are provided on an eighth layer. At some portions of the PCB 18, traces on the first layer and traces on the eighth layer overlap, and in those areas a solid line is shown.

Figure 9:
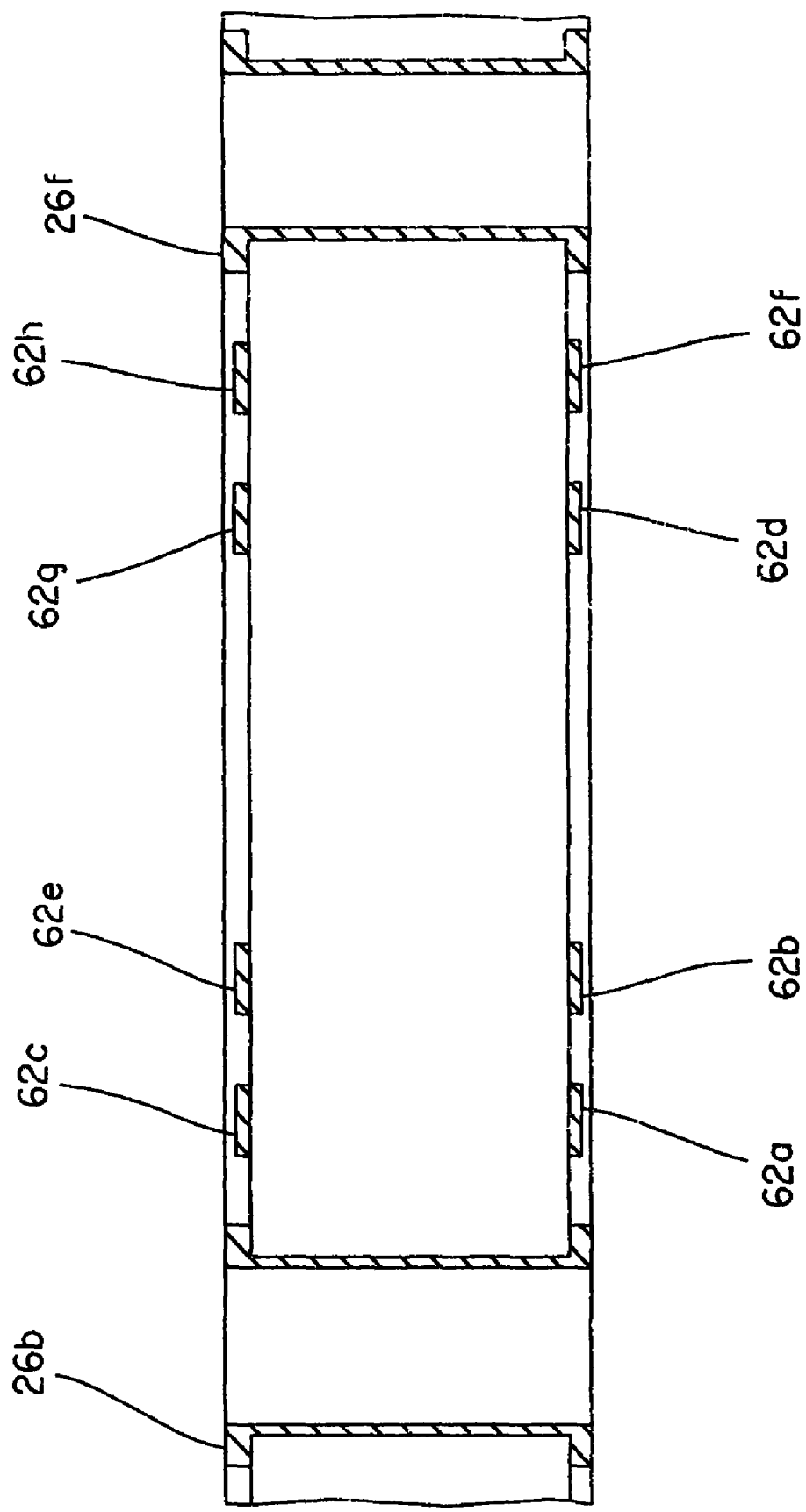
FIG. 9 is a cross-sectional view of a PCB along the line 9-9 of FIG. 8.

FIG. 9 shows a cross-sectional view of the PCB 18 through the line 9-9 of FIG. 8. Plated-through vias 26b and 26f are shown in FIG. 9, as are portions of first through eighth conductive traces 62a-h respectively associated with the first through eighth conductive pads 22a-h and IDCs 24a-h.

Figure 10:
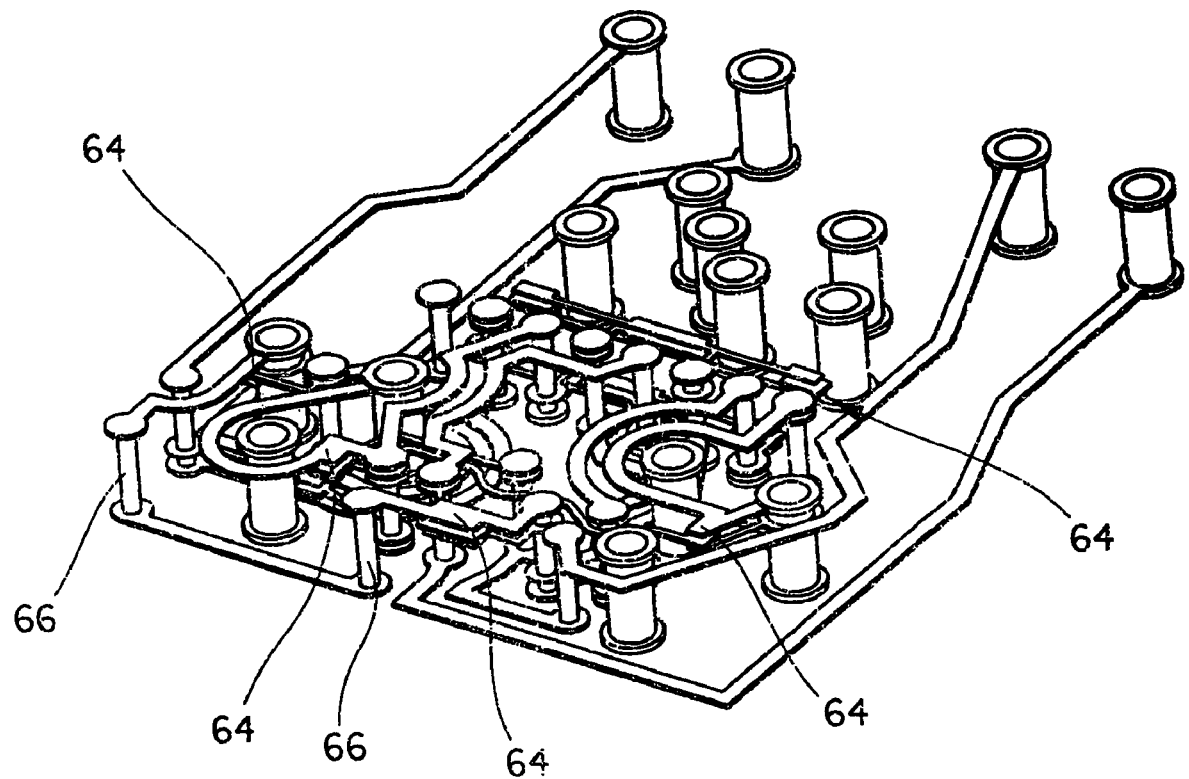
FIG. 10 is a rear perspective view of conductive traces of a PCB.
Figure 11:
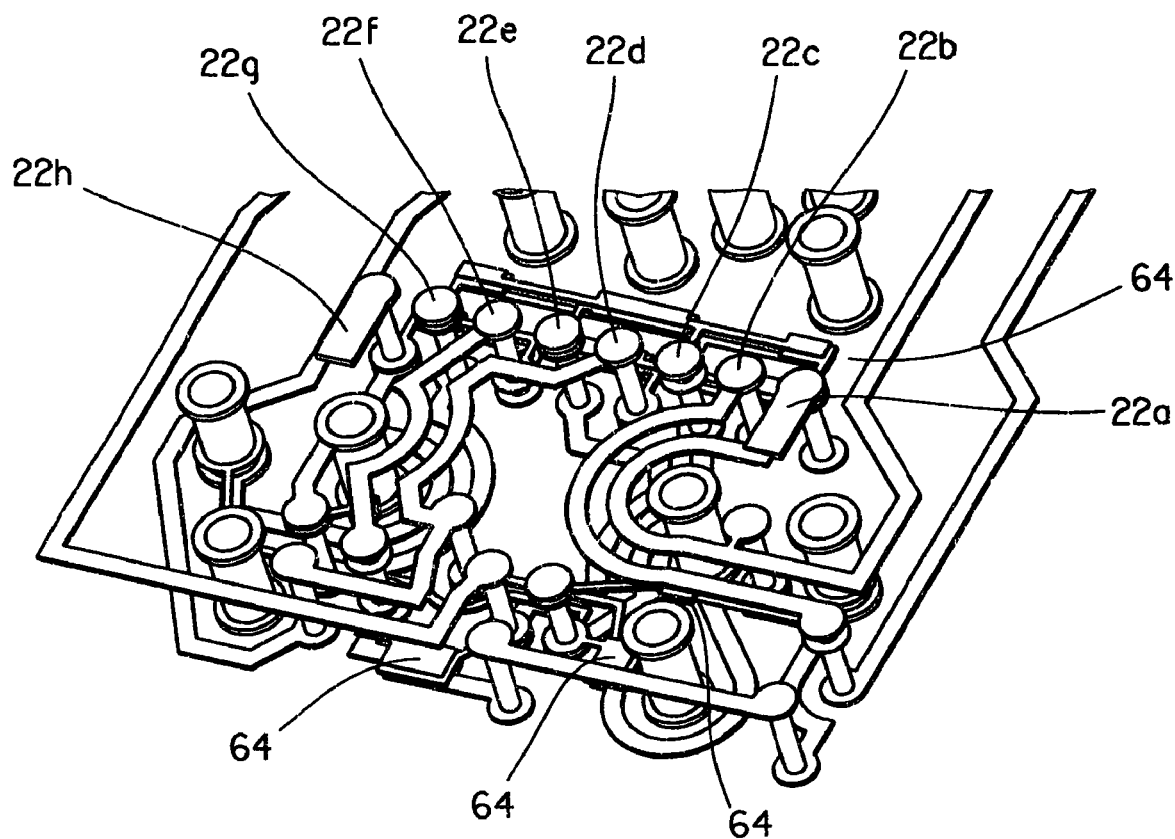
FIG. 11 is a front perspective view of conductive traces of a PCB.

FIGS. 10 and 11 show perspective views of conductive traces 62a-h of a PCB 18. Several layer-to-layer vias 66 are provided to allow conductive traces to transition from one conductive layer to another. FIGS. 10 and 11 illustrate that plate capacitors 64 may incorporate conductive plates positioned on several conductive layers. FIG. 11 shows the conductive pads 22a-22h.

Figure 12:
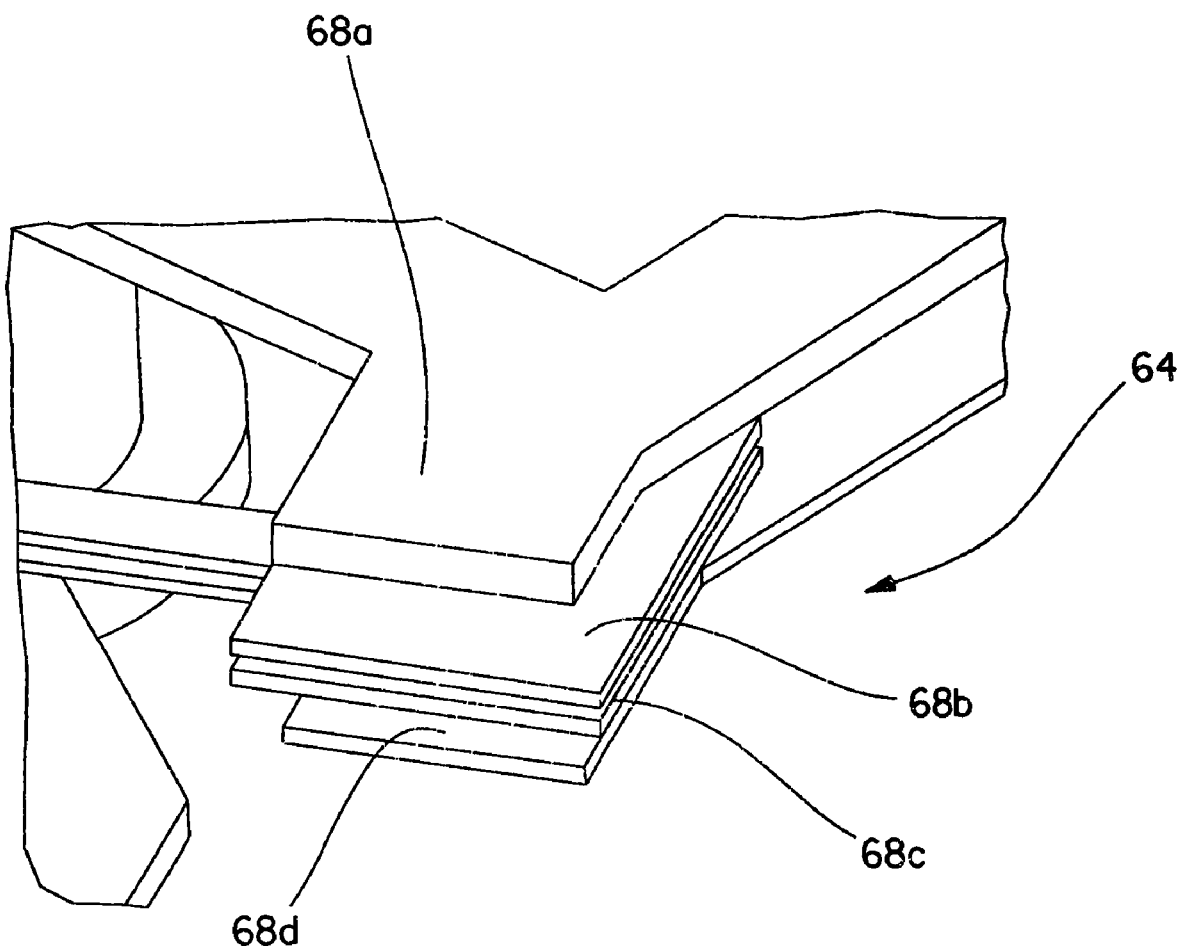
FIG. 12 is a perspective view of conductive layers of a plate capacitor.

FIG. 12 is a perspective view of a plate capacitor 64 according to one embodiment of the present invention. The plate capacitor 64 of FIG. 12 comprises four conductive layers 68a-d. The four conductive layers 68a-d include outer layers 68a and 68d and inner layers 68b and 68c. Dotted lines are used in FIG. 12 to illustrate portions of the layers 68a-d that would be hidden due to the perspective view. Dielectric layers are between the conductive layers, but for clarity the dielectric material has been omitted from FIG. 12. The plate capacitor 64 is constructed with the inner layers 68b and 68c having a larger surface area than the outer layers 68a and 68d. This results in a reduction in variation in capacitance from one circuit board to another due to registration tolerances in the manufacturing process.

Figure 13:
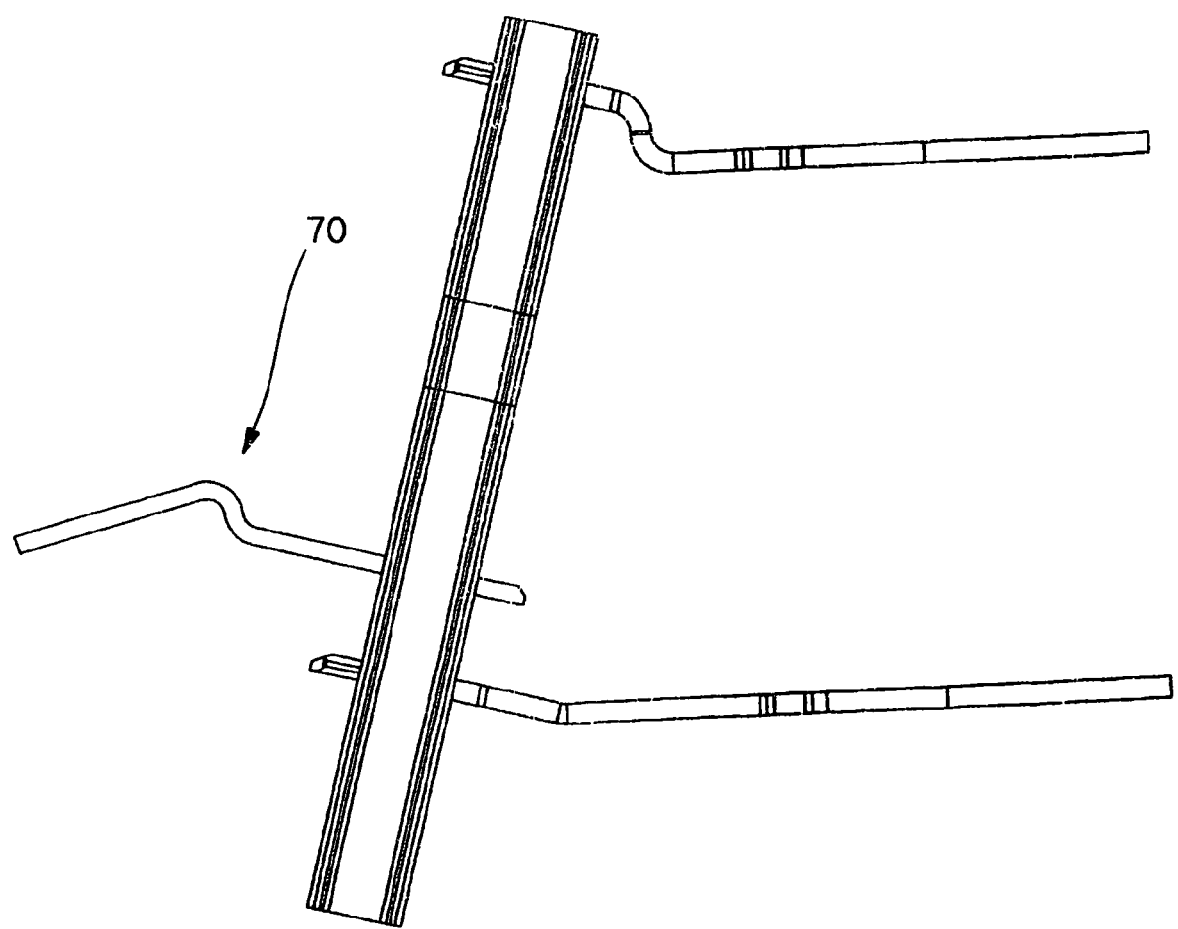
FIG. 13 is a side view of a simulated cantilevered plug interface contact.

The design of plug interface contacts 16a-16h as best illustrated in FIGS. 2 and 5 allows for superior maintenance of contact force between the plug interface contacts 16a-16h and the plug contacts 30 of inserted plugs, as compared to a simpler cantilevered plug interface contact design 70 as shown in FIG. 13. Simulations of plug insertion performed using Ansys™ engineering simulation software have shown that contacts 16b-16g as shown and described above will maintain proper contact force with future plug contacts after a plug has been inserted into and removed from a jack. Similar simulations show that the cantilevered plug interface contact design 70 will fail to maintain a proper contact force with future plug contacts of inserted plugs, after even one simulated insertion and removal of a plug. The plug interface contact design 70 was chosen for simulation because both the simulated design and the plug interface contacts 16b-16g have the same signal path length between plug contacts and a printed circuit board in the jack.

For example, it is desirable to maintain at least 100 grams of force (gf) as a contact force between a plug interface contact and a plug contact. Following insertion and removal of a plug, plug interface contacts having the design of the plug interface contacts 16b-16g were able to make 159 gf of contact force with a contact of a later-inserted simulated plug. A simulation of the simpler cantilevered plug interface contact design 70 shown in FIG. 13, however, showed that the simpler cantilevered plug interface contact 70 would only exert 37 gf of contact force on a contact of a later-inserted plug.

Similar simulations were performed on modeled versions of the outermost plug interface contacts 16a and 16h as best shown in FIGS. 2, 3, and 4. These simulations were performed using Ansoft™ software to simulate the effect of first inserting a six-position plug into a jack, and later inserting an eight-position plug into the jack. This simulated the housing of a six-position plug bending the contacts 16a and 16h to a greater extent than an eight-position plug would. Under this simulation, even after being bent by the housing of the six-position plug, the outermost contacts 16a and 16h were able to later maintain a contact force of 141.5 gf on contacts of an eight-position plug. An acceptable contact force of 122.9 gf between the modeled contacts and the conductive pads 22a and 22h was also maintained upon insertion of the modeled eight-position plug after the simulated insertion and removal of the six-position plug.

It is to be understood that modifications to the shown embodiments may be made while still falling within the scope of the present invention. For example, while the above-described embodiments show eight-contact jacks, it is to be understood that jacks according to the present invention may be provided with more or fewer than eight contacts, depending on the particular application for the jack, with proper modifications made to accommodate more or fewer contacts.

The invention claimed is:

1. A communications connector for mating with a communications plug having plug contacts, said connector comprising:
   a printed circuit board having conductive pads thereon;
   a support; and
   at least one plug interface contact mechanically connected to said printed circuit board and positioned to make electrical contact with one of said plug contacts of said communications plug when said communications plug is mated with said communications connector, at least a portion of said plug interface contact forming an electrically conductive pathway between said plug contact of said communication plug and said conductive pad of said printed circuit board, said plug interface contact being provided with:
   a first curve that provides contact force between said plug interface contact and said conductive pad of said printed circuit board;
   a second curve where said plug interface contact meets said conductive pad of said printed circuit board;
   a third curve where said plug interface contact makes electrical contact with said contact of said communications plug when said communications plug is mated with said communications connector; and
   a fourth curve that rides along said support, providing additional mating force between said plug contact and said plug interface contact.

2. The communications connector of claim 1 wherein said electrically conductive pathway is provided between said second curve and said third curve of said plug interface contact.

3. The communications connector of claim 2 wherein said printed circuit board is provided at an angle relative to an insertion direction of said plug into said communications connector, said angle allowing for a decreased length of said conductive pathway by providing a decreased distance between said conductive pad and said plug contact.

* * * * *